United States Patent
Khanolkar et al.

(10) Patent No.: US 12,463,158 B2
(45) Date of Patent: Nov. 4, 2025

(54) MICROELECTRONIC DEVICE PACKAGE WITH INTEGRAL ANTENNA MODULE AND SEMICONDUCTOR DEVICE

(71) Applicant: Texas Instruments Incorporated, Dallas, TX (US)

(72) Inventors: Vijaylaxmi Gumaste Khanolkar, Pune (IN); Anindya Poddar, Sunnyvale, CA (US); Hassan Omar Ali, Murphy, TX (US); Dibyajat Mishra, Plano, TX (US); Venkatesh Srinivasan, Plano, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 529 days.

(21) Appl. No.: 17/877,426

(22) Filed: Jul. 29, 2022

(65) Prior Publication Data

US 2024/0038691 A1    Feb. 1, 2024

(51) Int. Cl.
*H01L 23/48*    (2006.01)
*H01L 21/56*    (2006.01)
*H01L 23/00*    (2006.01)
*H01L 23/498*    (2006.01)
*H01L 23/66*    (2006.01)
*H01Q 1/22*    (2006.01)

(52) U.S. Cl.
CPC ............ *H01L 23/66* (2013.01); *H01L 21/561* (2013.01); *H01L 21/565* (2013.01); *H01L 23/49805* (2013.01); *H01L 23/49811* (2013.01); *H01L 23/49816* (2013.01); *H01L 23/49822* (2013.01); *H01L 23/49833* (2013.01); *H01L 23/49838* (2013.01); *H01L 24/96* (2013.01); *H01L 24/97* (2013.01); *H01Q 1/2283* (2013.01); *H01L 24/16* (2013.01); *H01L 2223/6677* (2013.01); *H01L 2223/6683* (2013.01); *H01L 2223/6688* (2013.01); *H01L 2224/16225* (2013.01); *H01L 2924/182* (2013.01); *H01L 2924/2027* (2013.01)

(58) Field of Classification Search
None
See application file for complete search history.

(56) References Cited

U.S. PATENT DOCUMENTS

| | | | |
|---|---|---|---|
| 2,153,589 A * | 4/1939 | Peterson | H01Q 11/04 343/834 |
| 6,770,955 B1 * | 8/2004 | Coccioli | H01L 23/3128 257/784 |

(Continued)

FOREIGN PATENT DOCUMENTS

CN    107393883 A    11/2017

OTHER PUBLICATIONS

PCT Search Report Mailed Nov. 13, 2023, 4 pgs.

*Primary Examiner* — Nicholas J Tobergte
(74) *Attorney, Agent, or Firm* — Dawn Jos; Frank D. Cimino

(57) ABSTRACT

In a described example, an apparatus includes: a semiconductor device mounted to a device side surface of a package substrate, the package substrate having a board side surface opposite the device side surface; an antenna module mounted to the package substrate and coupled to the semiconductor device; and mold compound covering the semiconductor device and a portion of the package substrate.

19 Claims, 14 Drawing Sheets

(56) References Cited

U.S. PATENT DOCUMENTS

| | | | |
|---|---|---|---|
| 2003/0153127 A1* | 8/2003 | Wada | H01L 24/75 |
| | | | 438/118 |
| 2004/0090385 A1* | 5/2004 | Green | H01Q 1/245 |
| | | | 343/702 |
| 2008/0191028 A1* | 8/2008 | Kagaya | H01F 1/14791 |
| | | | 235/492 |
| 2010/0156749 A1* | 6/2010 | Kim | H05K 1/0218 |
| | | | 343/866 |
| 2015/0295305 A1* | 10/2015 | Herbsommer | H01L 23/495 |
| | | | 343/873 |
| 2015/0340757 A1* | 11/2015 | Rho | H01Q 5/342 |
| | | | 343/702 |
| 2016/0172762 A1* | 6/2016 | Chiu | H01Q 1/40 |
| | | | 343/700 MS |
| 2020/0212536 A1* | 7/2020 | Gupta | H01Q 1/2283 |
| 2020/0315001 A1 | 10/2020 | Khan et al. | |
| 2020/0350180 A1* | 11/2020 | Yen | H01Q 1/526 |
| 2020/0373259 A1* | 11/2020 | Koller | H01L 21/4853 |
| 2021/0273315 A1* | 9/2021 | Cheng | H01L 23/5385 |
| 2022/0158318 A1* | 5/2022 | Khripkov | H01P 1/2013 |

\* cited by examiner

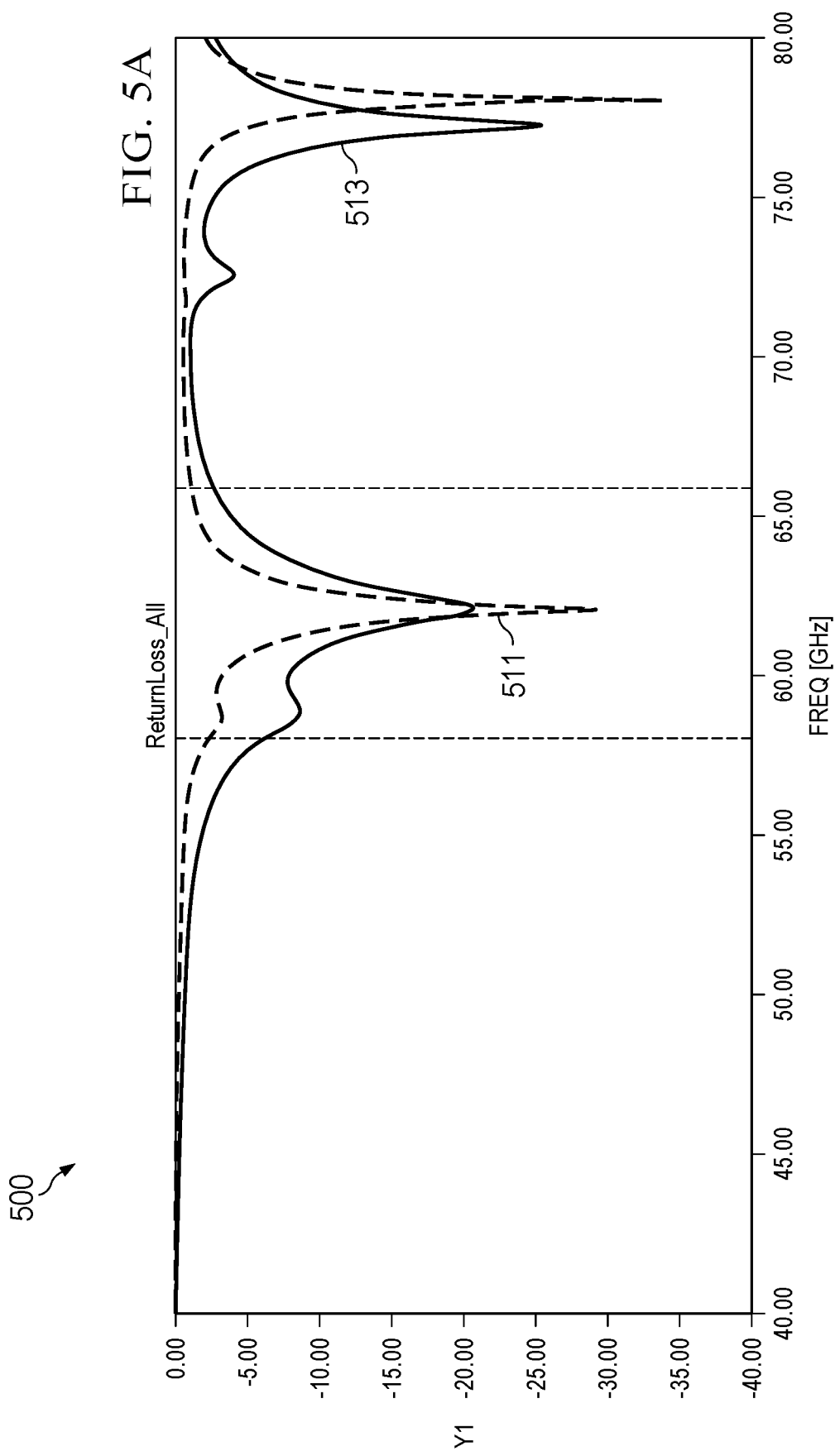

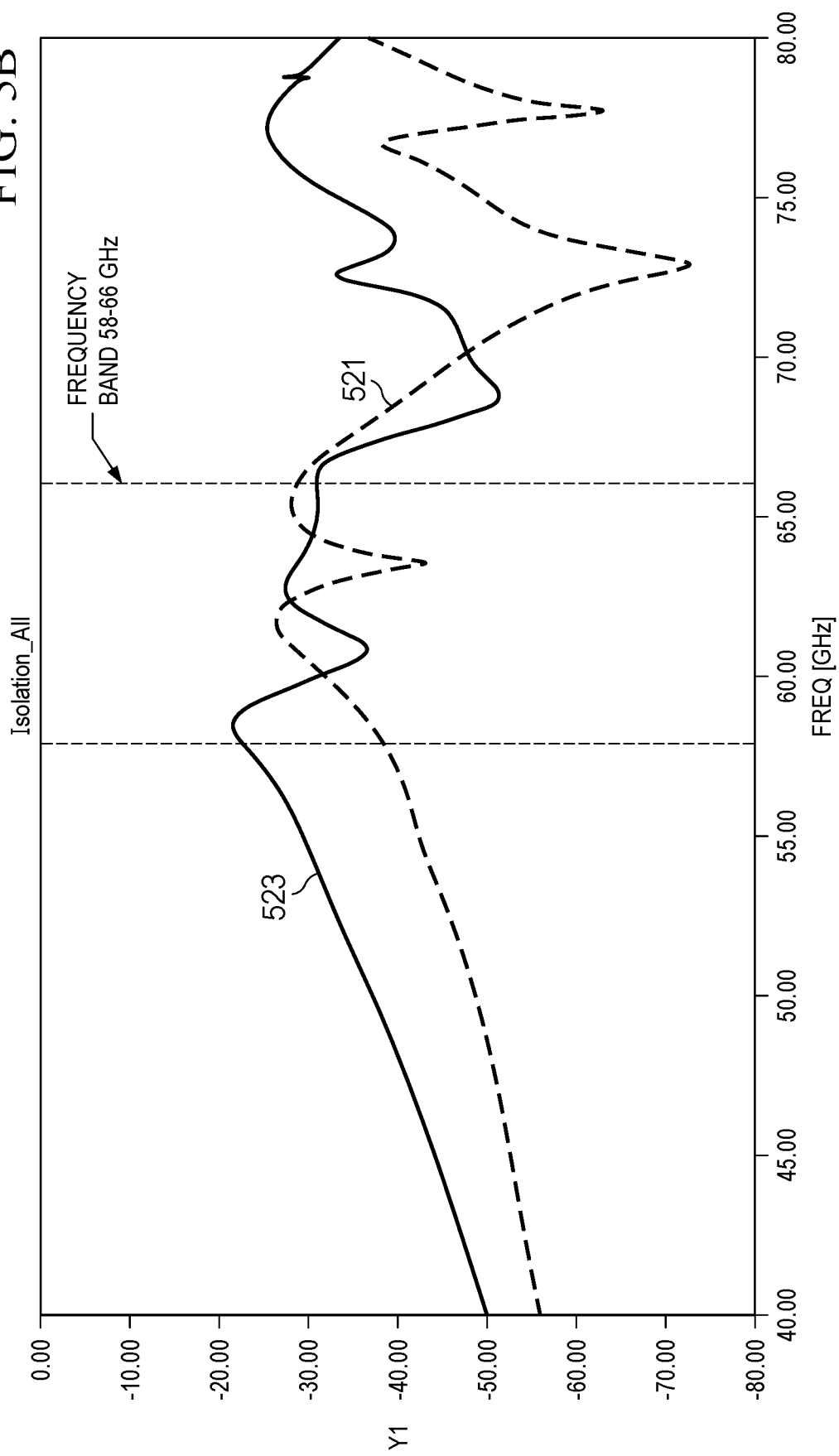

MICROELECTRONIC DEVICE PACKAGE WITH INTEGRAL ANTENNA MODULE AND SEMICONDUCTOR DEVICE

TECHNICAL FIELD

This relates generally to microelectronic device packages, and more particularly to microelectronic device packages including one or more integral antenna modules and one or more semiconductor devices.

BACKGROUND

Processes for producing microelectronic device packages include mounting a semiconductor die to a package substrate, and covering the electronic devices with a dielectric material such as a mold compound to form packaged devices.

Incorporating antennas with semiconductor devices in a microelectronic device package is desirable. Antennas are increasingly used with microelectronic devices and portable devices, such as communications systems, communications devices including 4G, 5G or LTE capable cellphones, tablets, and smartphones. Additional applications include microelectronic devices in automotive systems such as radar, navigation and over the air communications systems. Frequencies used can include millimeter wave and other GHz frequencies, as well as other frequencies. Systems using antennas with packaged semiconductor devices therefore often place the antennas on a high performance substrate such as those used for a printed circuit board, an organic substrate or other low dielectric substrate. The semiconductor device can be mounted to the high performance substrate, near the antennas. These approaches often employ expensive printed circuit board (PCB) substrates, which are sometimes used inside a molded package with mold compound covering the semiconductor devices. These solutions are relatively high in cost and require substantial device area. Forming microelectronic device packages including efficient and cost effective antennas within the microelectronic device packages remains challenging.

SUMMARY

In a described example, an apparatus includes: an apparatus includes: a semiconductor device mounted to a device side surface of a package substrate, the package substrate having a board side surface opposite the device side surface; an antenna module mounted to the package substrate and coupled to the semiconductor device; and mold compound covering the semiconductor device and a portion of the package substrate.

In a further described example, a method includes: forming a die pad and routing patterns in a conductor layers to couple an antenna module to a semiconductor device on a package substrate; mounting the semiconductor device to the package substrate; mounting an antenna module to the package substrate, the conductor layer coupling the antenna module to the semiconductor device; covering the semiconductor device and a portion of the package substrate with mold compound to form microelectronic device packages; and separating the microelectronic device packages one from another by cutting through the mold compound in saw streets between the devices.

BRIEF DESCRIPTION OF THE DRAWINGS

FIG. 5A illustrates, in a graph, a simulation result showing return loss data for a microelectronics device package using an arrangement and a comparison to a microelectronics device package formed without the arrangements; FIG. 5B illustrates, in a graph, a simulation result showing channel to channel isolation data for a microelectronics device package using an arrangement and a comparison to a microelectronics device package formed without the arrangements.

DETAILED DESCRIPTION

Figure 1A:
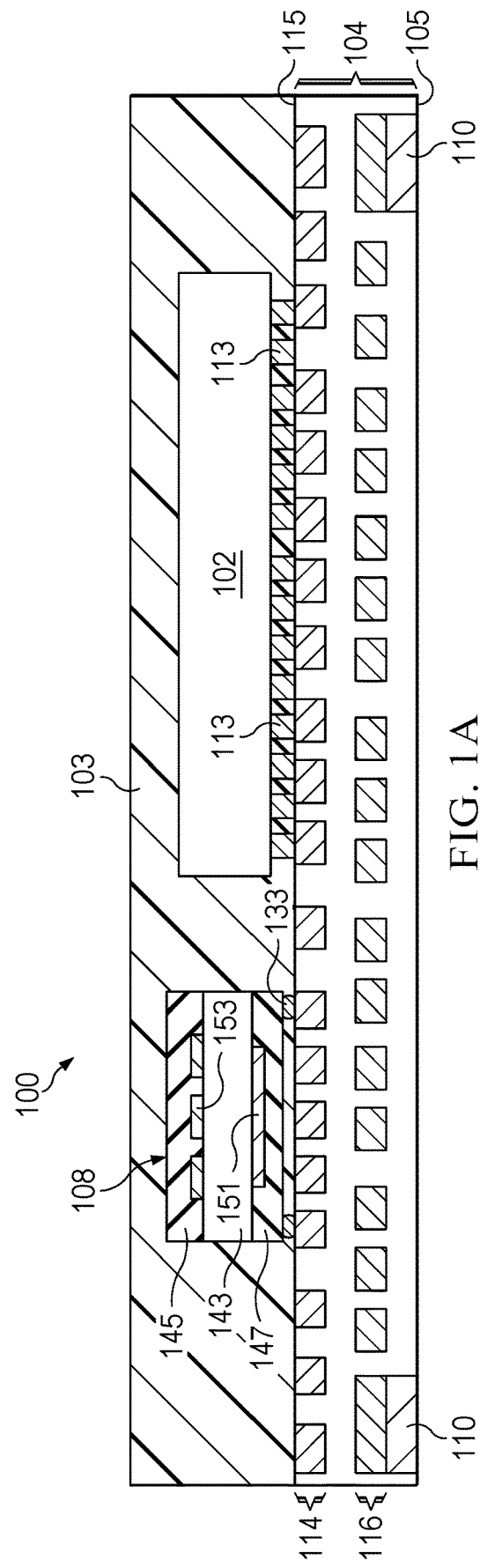
FIGS. 1A-1E illustrate, in cross sectional views, arrangements for antenna modules and semiconductor devices in microelectronic device packages.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor device" is used herein. A semiconductor device can be a discrete semiconductor device such as a bipolar transistor, a few discrete devices such as a pair of power FET switches fabricated together on a single semiconductor die, or a semiconductor device can be an integrated circuit with multiple semiconductor devices such as the multiple capacitors in an A/D converter. The semiconductor device can include passive devices such as resistors, inductors, filters, sensors, or active devices such as transistors. The semiconductor device can be an integrated circuit with hundreds or thousands of transistors coupled to form a functional circuit, for example a microprocessor or memory device. The semiconductor device can be a radio transceiver or a radar transceiver. The semiconductor device can be a receiver or a transmitter. When semiconductor devices are fabricated on a semiconductor wafer and then individually separated from the semiconductor wafer, the individual units are referred to as "semiconductor dies". A semiconductor die is also a semiconductor device.

The term "microelectronic device package" is used herein. A microelectronic device package has at least one semiconductor die electrically coupled to terminals, and has a package body that protects and covers the semiconductor die. The microelectronic device package can include additional elements, in some arrangements an integrated antenna is included. Passive components such as capacitors, resistors, and inductors or coils can be included. In some arrangements, multiple semiconductor dies can be packaged together. For example, a power metal oxide semiconductor (MOS) field effect transistor (FET) semiconductor die and a logic semiconductor die (such as a gate driver die or a controller die) can be packaged together to from a single packaged electronic device. The semiconductor die is mounted to a package substrate that provides conductive leads, a portion of the conductive leads form the terminals for the packaged device. The semiconductor die can be mounted to the package substrate with a device side surface facing away from the substrate and a backside surface facing and mounted to a die pad of the package substrate. In wire bonded semiconductor device packages, bond wires couple conductive leads of a package substrate to bond pads on the semiconductor die. The semiconductor device package can have a package body formed by a thermoset epoxy resin in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions provide the terminals for the semiconductor device package.

The term "package substrate" is used herein. A package substrate is a substrate arranged to receive a semiconductor die and to support the semiconductor die in a completed semiconductor device package. Package substrates useful with the arrangements include conductive lead frames, molded interconnect substrates (MIS), partially etched lead frames, pre-molded lead frames, and multilayer package substrates. When conductive lead frames are used as a package substrate, the lead frames can be formed from copper, aluminum, stainless steel, steel and alloys such as Alloy 42 and copper alloys. The package substrate can have a die pad on a device side surface, and in alternative arrangements, can have more than one die pad on the device side surface for mounting semiconductor devices. A semiconductor die can be placed on a die pad for each packaged device, and die attach or die adhesive can be used to mount the semiconductor dies to the lead frame die pads. In some arrangements, a flip chip die mount is used, where post connects that extend from bond pads on the semiconductor device are attached by a solder joint to conductive lands on the device side surface of the package substrate. The post connects can be solder bumps or other conductive materials such as copper or gold with solder on a distal end. Copper pillar bumps can be used. In wire bonded packages, bond wires can couple bond pads on the semiconductor dies to the leads on the device side surface of the package substrate. When the package substrate is a lead frame, the lead frames may have plated portions in areas designated for wire bonding, for example silver plating can be used. After the bond wires are in place, a portion of the package substrate, the semiconductor die, and at least a portion of the die pad can be covered with a protective material such as a mold compound.

The term "multilayer package substrate" is used herein. A multilayer package substrate is a substrate that has multiple conductor layers including conductive traces, and which has vertical conductive connections extending through the dielectric material between the conductor layers. In an example arrangement, a multilayer package substrate is formed in an additive manufacturing process by plating a patterned conductor level and then covering the conductor with a layer of dielectric material. Grinding or thinning can be performed on the dielectric material to expose portions of top surface of the layer of conductors from the dielectric material. Additional plating layers can be formed to add additional levels of conductors, some of which are trace layers that are coupled to other trace layers in the dielectric materials by vertical connectors, and additional dielectric material can be deposited at each trace layer level and can cover the conductors. By using an additive or build up manufacturing approach, and by performing multiple plating steps, multiple molding steps, and multiple grinding steps, a multilayer package substrate is formed with an arbitrary number of trace layers. In an example arrangement, copper, gold or tungsten conductors are formed by plating, and a thermoplastic material can be used as the dielectric material. The vertical connections between conductor layers can be of arbitrary shapes and sized and can include rails and pads to couple trace layers with low resistance for power and high current signals. Unlike vias in a printed circuit board technology, the vertical connections are not formed by plating conductors in holes mechanically drilled through a dielectric material, which are limited in size and shape, instead in an additive approach the vertical connections are plated during the additive manufacturing process and thus the vertical connections can have a variety of shapes and sizes.

In packaging microelectronic and semiconductor devices, mold compound may be used to partially cover a package substrate, to cover components, to cover a semiconductor die, and to cover the electrical connections from the semiconductor die to the package substrate. This molding process can be referred to as an "encapsulation" process, although some portions of the package substrates are not covered in the mold compound during encapsulation, for example terminals and leads are exposed from the mold compound to enable electrical connections to the packaged device. Encapsulation is often a compressive molding process, where thermoset mold compound such as resin epoxy can be used. A room temperature solid or powdered mold compound can be heated to a liquid state and then molding can be performed by pressing the liquid mold compound into a mold through runners or channels. Transfer molding can be used. Unit molds shaped to surround an individual device may be used, or block molding may be used, to form multiple packages simultaneously for several devices from mold compound. The devices to be molded can be provided in an array or matrix of several, hundreds or even thousands of devices in rows and columns that are then molded together.

After the molding, the individual packaged devices are cut apart from each other in a sawing operation by cutting through the mold compound and package substrate in saw streets formed between the devices. Portions of the package substrate leads are exposed from the mold compound package to form terminals for the packaged semiconductor device.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and the saw will traverse the molded electronic devices in two different directions to cut apart the packaged electronic devices from one another in the array.

The term "quad flat no-lead" (QFN) is used herein for a type of electronic device package. A QFN package has conductive leads that are coextensive with the sides of a molded package body, and in a quad package the leads are on four sides. Alternative flat no-lead packages may have leads on two sides or only on one side. These can be referred to as small outline no-lead or SON packages. No-lead packaged electronic devices can be surface mounted to a board. Leaded packages can be used with the arrangements where the leads extend away from the package body and are shaped to form a portion for soldering to a board. A dual in line package (DIP) can be used with the arrangements. A small outline package (SOP) can be used with the arrangements. Small outline no-lead (SON) packages can be used, and a small outline transistor (SOT) package is a leaded package that can be used with the arrangements. Leads for leaded packages are arranged for solder mounting to a board. The leads can be shaped to extend towards the board, and form a mounting surface. Gull wing leads, J-leads, and other lead shapes can be used. In a DIP package, the leads end in pin shaped portions that can be inserted into conductive holes formed in a circuit board, and solder is used to couple the leads to the conductors within the holes.

The term "antenna" is used herein. As used herein, an antenna is a structure arranged to transmit or receive signals over the air, such as radio signals or radar signals. In the arrangements, antenna modules are formed using low-k dielectric materials such as laminates with radiator elements patterned in layers, using conductors such as copper or aluminum, or by use of non-conductive antennas such as direct resonant antennas.

In the arrangements, a microelectronic device package includes a semiconductor device and at least one antenna module. The antenna modules can be independently formed apart from the semiconductor device. In an example, one or more antenna modules can be packaged with a semiconductor device to form the microelectronic device package. In an example the antenna modules are reusable components designed for a particular frequency and application, such as radar receive antennas, radar transmit antennas, and radio antennas. The antenna modules and the semiconductor device can be mounted on a package substrate. In the arrangements, the antennas are separate components from the package substrate. In example arrangements, a two level multilayer package substrate, a laminate package substrate, or a lead frame, can be used to mount the antennas and the semiconductor device. The package substrate can include conductors that form routing connections between the semiconductor device, the antenna modules, and terminals of the microelectronic device package. Use of the antenna modules with the multilayer package substrate allows for a less expensive package substrate with fewer layers, reduces costs and can reduce the overall size of the microelectronic device package. The antenna modules can be formed of a high performance dielectric material and conductors, and because the antenna modules are much smaller than the package substrate, the overall cost of the microelectronic device package is reduced while high performance is still achieved. In an example arrangement the antenna modules can be cored laminates using BT resin and copper foils. Other materials can also be used to form the antenna modules.

In some example arrangements, the package substrate has a device side surface, a semiconductor die mounted on a portion of the device side surface, and an antenna module or antenna modules mounted on the device side surface spaced from the die pad portion. The antenna modules can include elements formed as radiators. In an example the antenna modules include conductors formed as radiators, and a ground plane or reflector spaced from the conductors by dielectric material. In alternative examples the radiators can be formed as direct resonating structures using conductors or by using dielectrics or cavities. A printed circuit board with a core and two layers can be used, for example, or other laminates or layered modules can be used to form the antenna modules. The antenna modules can include BT resin, FR4, ceramic, another cored laminate, a coreless laminate, or other low-k dielectric materials. A semiconductor die mounted to the device side surface of the package substrate can be coupled to the antenna module by conductive traces formed in trace layers of the package substrate. In one example, the semiconductor device is flip chip mounted to a multilayer package substrate, and the antenna module is similarly mounted to the multilayer package substrate. In another example, the semiconductor device is flip chip mounted to a device side surface of a multilayer package substrate, while the antenna module is mounted on a board side surface of the multilayer package substrate and is positioned between the microelectronic device package and a system board. In some arrangements, the semiconductor device and the antenna module can be completely covered by mold compound or another encapsulation material such as an epoxy or resin. In other arrangements, at least the launch side surface of the antenna module is exposed from the mold compound. In some arrangements the antenna modules are mounted to launch from an exposed top surface of the microelectronic device package that faces away from a system board. In other arrangements the antenna modules are positioned on a board side surface of the package substrate and launch towards the system board and an opening or waveguide carries the radiation from the antenna through the system board. In additional arrangements the antenna modules can be arranged to launch from a side or end of the microelectronic device package that is oriented in a direction that is normal to the surface of a system board.

In an example arrangement, an antenna module mounted in the microelectronic device package is arranged to operate in the millimeter wave frequency range, between 30 GHz and 300 GHz, with signals having wavelengths in air between 10 millimeters and 1 millimeters. Other frequency signals such as RF signals can be transmitted or received by the antenna modules. Radar signals can be transmitted and received by the antennas. The antennas can have conductors as radiator elements such as copper or aluminum. In alterative arrangements, the antennas can be direct resonant antennas that are formed by using dielectric materials, without the use of conductors. In some arrangements, a reflector or ground plane is formed in the antenna modules spaced from the radiator elements. In an example arrangement the reflector is spaced from the radiator elements by a multiple of a signal wavelength, to provide a reflection that constructively interferes with the energy from the radiator elements, to increase signal strength from the antennas.

The semiconductor device used in the arrangements can be a monolithic millimeter wave integrated circuit (MMIC). The MMIC can be a transmitter, receiver, transceiver, or a component in a system for transmitting or receiving signals. The semiconductor device can be provided as multiple semiconductor dies or as a semiconductor die with additional components mounted to the multilayer package substrate, to form a system. Additional passive components can be mounted to the multilayer package substrate.

FIGS. 1A-1F illustrate example arrangements. FIG. 1A illustrates, in a cross sectional view, a microelectronic device package 100. In the illustrated example arrangement the microelectronic device package is a quad flat no lead (QFN) package. QFN packages are one type of package that are increasingly used as the QFN package terminals are within the footprint of the package body, reducing board area requirements, and the QFN package is useful with the arrangements. Other package types including leaded packages, and other no lead packages can be used. The microelectronic device package 100 includes a package substrate 104. Terminals 110 are formed of a conductor material on a board side surface 105 (the bottom surface as oriented in FIG. 1A) of the microelectronic device package 100. Vertical connectors (not shown) extend from terminals 110 through layers of dielectric material of the multilayer package substrate 104 to a device side surface 115 of the package substrate 104. A semiconductor die 102 is mounted to the device side surface 115 of the multilayer package substrate 104. The semiconductor die 102 in the illustrated example is flip chip mounted, so that a surface of the semiconductor die 102 with bond pads is oriented facing the device side surface of the package substrate 104. Conductive post connects 113 extend from the bond pads on semiconductor die 102 and make electrical connections between semiconductor die 102 and conductors in package substrate 104. In the example arrangement, the package substrate 104 is a multilayer package substrate that has a first trace layer 114, which includes portions that are exposed at the device side surface 115 to connect to the conductive post connects 113 of the semiconductor device 102, and a second trace layer 116, which includes portions coupled to the terminals 110. Vertical connections are formed in the multilayer package substrate 104 between the trace layer 114 and trace layer 116, but the vertical connections are not shown for simplicity of illustration.

Antenna module 108 is a separate component that is mounted to the package substrate 104 on the device side surface 115, and spaced from the semiconductor device 102. The antenna module 108 can be formed using a bismaleimide triazine ("BT") dielectric with laminates over a resin core, for example. The antenna module 108 includes conductor layer 153 which forms radiator elements for the antenna module 108 and a ground plane reflector 151. In an example, the antenna module 108 can have a core 143 and dielectric layers 145, 147 on opposite sides of the core 143, with the conductor layer 153 formed on the upper side of the core 143 (as the elements are oriented in FIG. 1A) and the ground plane reflector 151 formed on the opposite side of the core 143. The dielectric layers 145, 147 cover the conductor layer 153 and the ground plane reflector 151 respectively. The dielectric layers 145, 147 can be prepreg layers, as are used in forming laminate circuit boards, for example. Conductor layer 153 and ground plane reflector 151 can be formed using foils applied to the core 143, and patterned, or can be plated materials. The conductor layers can be, for example, copper or aluminum, and can be plated with additional layers, such as tungsten.

The antenna module 108 is mounted to the device side surface 115 of the multilayer package substrate 104, for example using solder balls. After the semiconductor device 102 with the post connects, which have solder on the ends placed on the package substrate 104, and the antenna module 108, with solder balls for example, are placed on the multilayer package substrate 104, a solder reflow process can be used to form solder joints between the semiconductor device 102 and conductors in the trace layer 114 of the package substrate, and solder joints can form between the antenna module 108, and conductors in trace layer 114 of the package substrate 104. The solder joints electrically couple and mechanically attach the antenna module 108 and the semiconductor device 102 to the package substrate 104.

A mold compound 103 is formed covering the semiconductor device 102 and the antenna module 108. The mold compound 103 also covers the device side surface 115 of the multilayer package substrate 104, but does not cover the terminals 110, which remain exposed for use in mounting the microelectronic device package 100 to a system board. The mold compound 103 can be an electronic mold compound (EMC) such as a thermoset epoxy resin, and can include fillers to enhance strength and thermal dissipation. Other dielectric materials such as resins, epoxies, and plastics can be used for the mold compound 103.

Figure 1B:
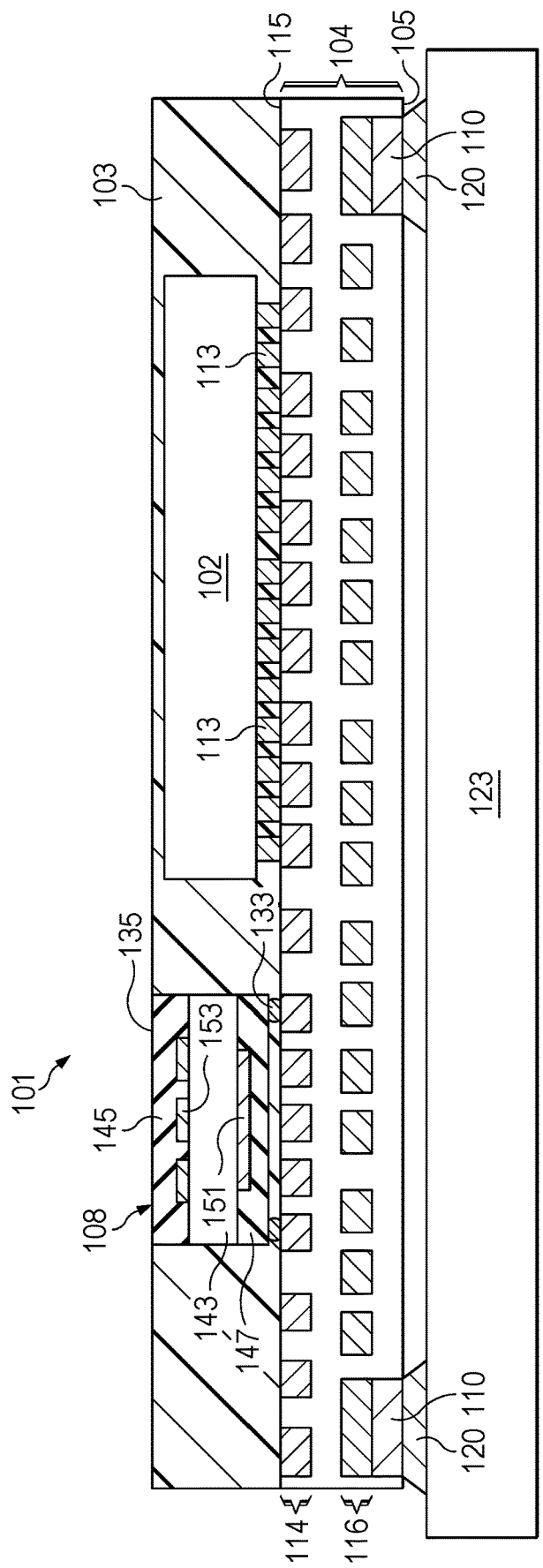

FIG. 1B illustrates, in another cross sectional view, an alternative arrangement. A microelectronic device package 101 similar to the microelectronic device package 100 (see FIG. 1A) is shown. In the example of FIG. 1B, the microelectronic device package 101 is a QFN package. The microelectronic device package 101 is shown surface mounted to a system board 123, with solder joints 120 formed between the terminals 110 of the microelectronic device package 101 and the system board 123. In this alternative arrangement, the antenna module 108 has a surface 135 that is exposed from mold compound 103, which has been thinned after molding using a mechanical grinding operation. By exposing the surface 135 of the antenna module 108 from the mold compound 103, the performance of the antenna module 108 can be improved, as the dielectric constant of the mold compound no longer affects the signals radiating from or entering antenna module 108. The remaining elements such as semiconductor device 102, package substrate 104, and the trace layers 114, 116 in the microelectronic device package 101 are the same as for microelectronic device package 100 in FIG. 1A.

Figure 1C:
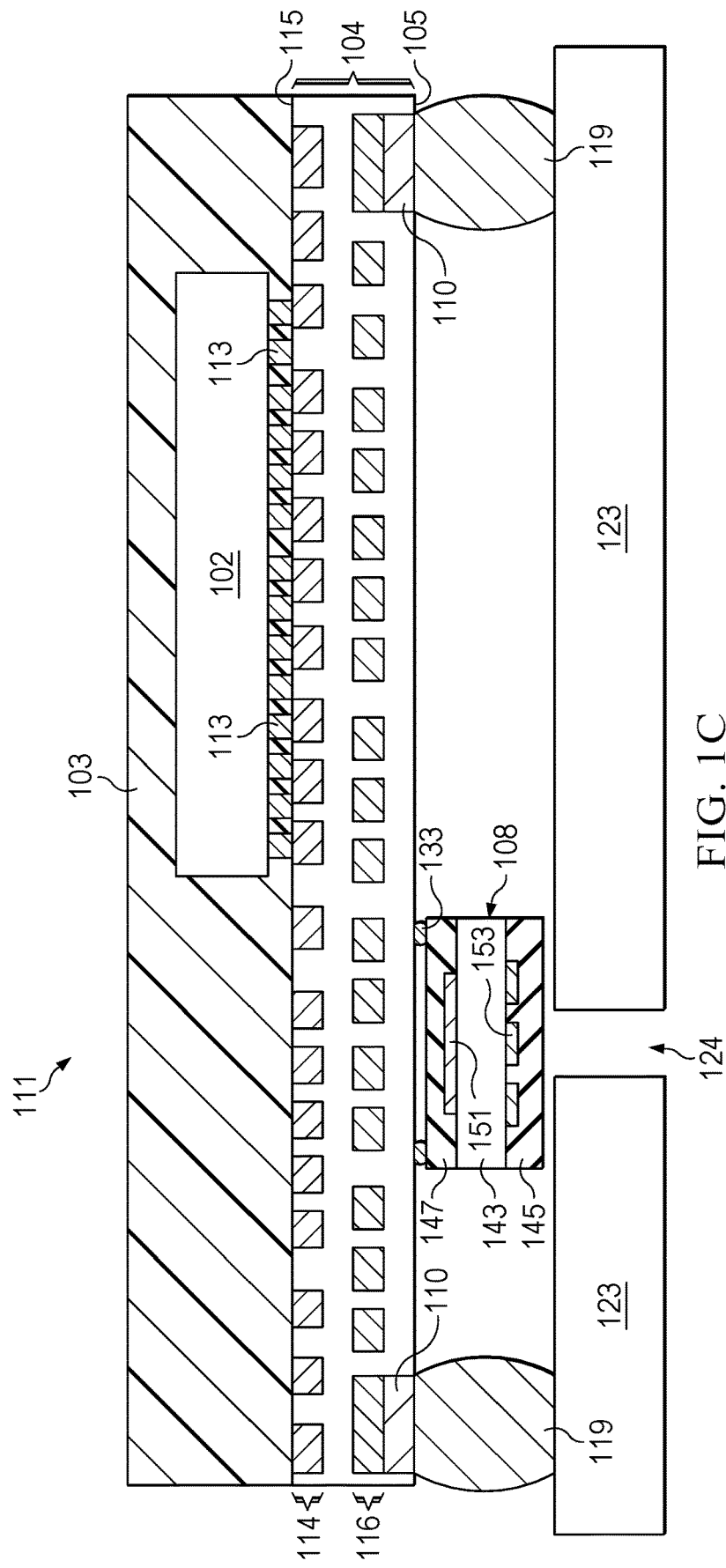

FIG. 1C illustrates another alternative arrangement for a microelectronics device package 111. In FIG. 1C, the antenna module 108 is shown mounted in a Launch on Package (LoP) configuration. The semiconductor device 102, mold compound 103, and package substrate 104 are otherwise arranged as in FIG. 1A, described above, with the semiconductor device 102 flip chip mounted to the package substrate 104 by post connects 113. The package substrate 104 in this arrangement is used in a ball grid array (BGA) package with solder balls 119 mounted to the package substrate 104 and contacting terminals 110 to form the external connections of the microelectronics device package 111. The antenna module 108 is mounted on the board side of the package substrate 104, and facing the system board 123 so that the signals will radiate towards or be received from the direction of the system board 123. In order to facilitate signals emanating from or traveling to the conductor layer 153 of the antenna module 108, an opening 124 is made in the system board 123 and aligned with the antenna module 108. In this example, the antenna module 108 can be a laminate with a core 143, a ground plane reflector 151, and dielectric layers 145, 147 covering the ground plane reflector 151 and the conductors 153. Solder balls 133 can be used to couple the antenna module 108 to the board side of the package substrate 104.

Figure 1D:
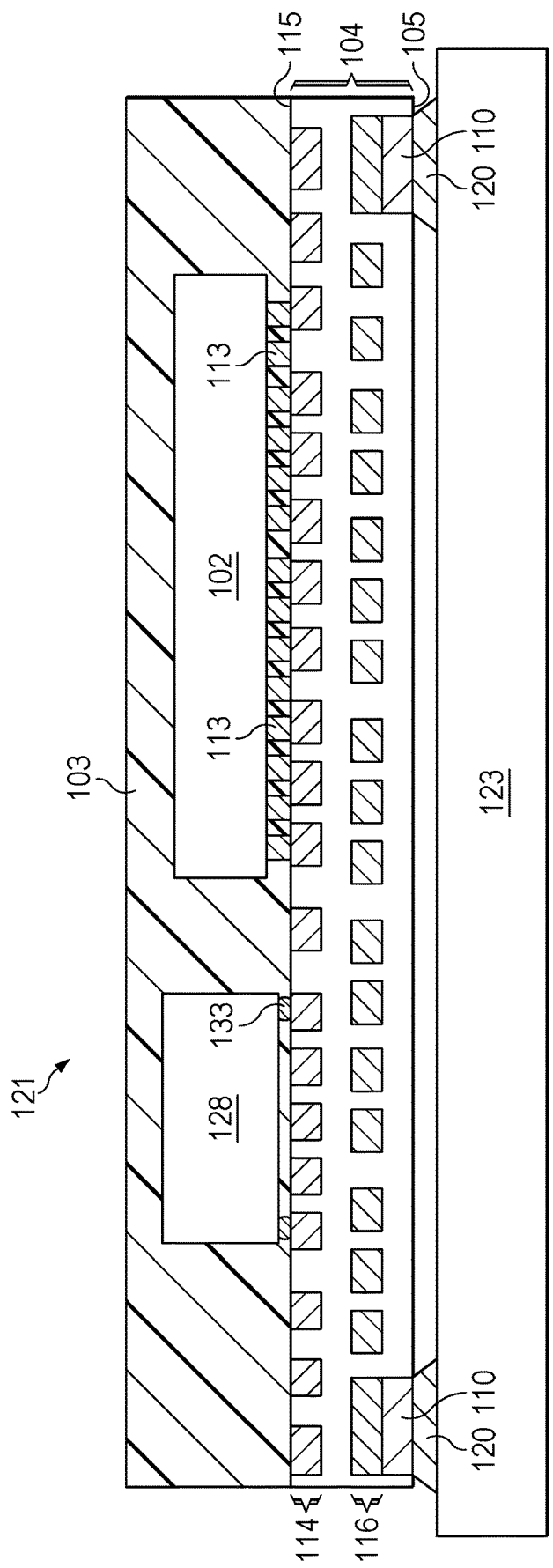

FIG. 1D illustrates, in another cross sectional view, an alternative arrangement for a microelectronics device package 121. In FIG. 1D, the semiconductor device 102 is flip chip mounted to a package substrate 104, and is covered by mold compound 103. The terminals 110 are shown soldered to a printed circuit board 123 by solder joints 120. An antenna module 128 can be formed of a variety of materials including semiconductor substrates, such as silicon, germanium, silicon germanium, or other dielectric materials with antennas such as glass, BT laminate as described above, or direct resonant antenna modules. The arrangement of FIG. 1D is similar to the arrangement of FIG. 1A in that the antenna module 128 is mounted to the device side surface of the package substrate 104, however in an alternative arrangement of FIG. 1D, the antenna module 128 can be mounted to the board side surface of multilayer package substrate 104 instead. The antenna module 108 can be coupled to the semiconductor device 102 using a feed structure formed on the multilayer package substrate 104, for example a slot feed or microstrip feed structure can be formed. The antenna module 108 can be coupled using a soft attach method such as a conductive die attach film or tape to couple the antenna module 108 to the package substrate 104.

Figure 1E:
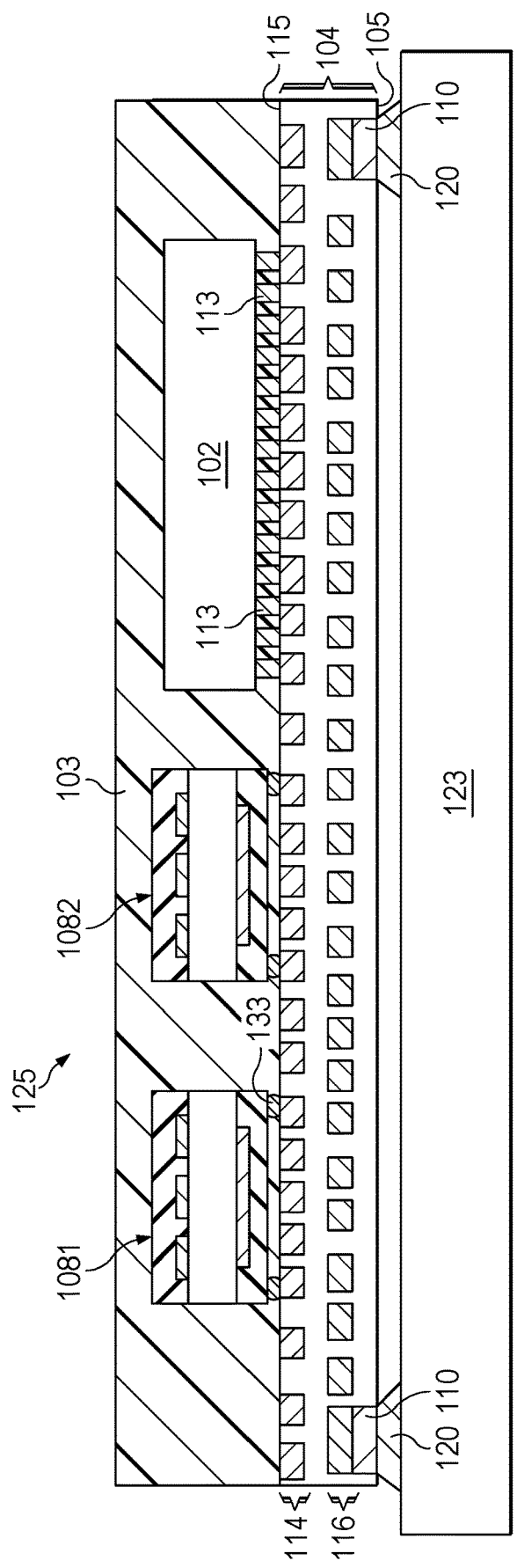

FIG. 1E illustrates, in another cross sectional view, an additional arrangement. In FIG. 1E, microelectronic device package 125 includes multiple antenna modules 1081, 1082 mounted on the device side surface 115 of the package substrate 104. The antenna modules 1081, 1082 can be instances of antenna 108 shown in FIGS. 1A-1D or 128 shown in FIG. 1D. The antenna modules 1081, 1082 can be identical or different from one another, for example the antenna modules 1081, 1082 can be a receiver antenna and a transmit antenna, or the antenna modules can be repeated instances of the same antenna, for example receiver antennas or transmit antenna for a radar application. In FIG. 1E, the mold compound 103 of the microelectronics device package 125 is shown covering both the antenna modules 1081, 1082; however, in an alternative arrangement the mold compound 103 can be thinned to expose the antenna modules 1081, 1082 such as is shown in FIG. 1B. While the antenna modules 1081, 1082 are shown mounted to the device side surface 115 of the package substrate 104, the antenna modules 1081, 1082 could also be mounted on the board side surface of the package substrate 104, similar to the arrangement shown in FIG. 1C. The microelectronic device package 125 has trace layers 114, 116 in the multilayer package substrate 104, nd has terminals 110 that are electrically coupled to the trace layer 116, and post connects 113 extend from the semiconductor device 102 which is flip chip mounted, and these post connects 113 couple the semiconductor device 102 to the trace layer 114 in the multilayer package substrate 104. The microelectronics device package 125 is mounted to circuit board 123 by solder joints 120, which electrically couple the terminals 110 to the circuit board 123.

Figure 1F:
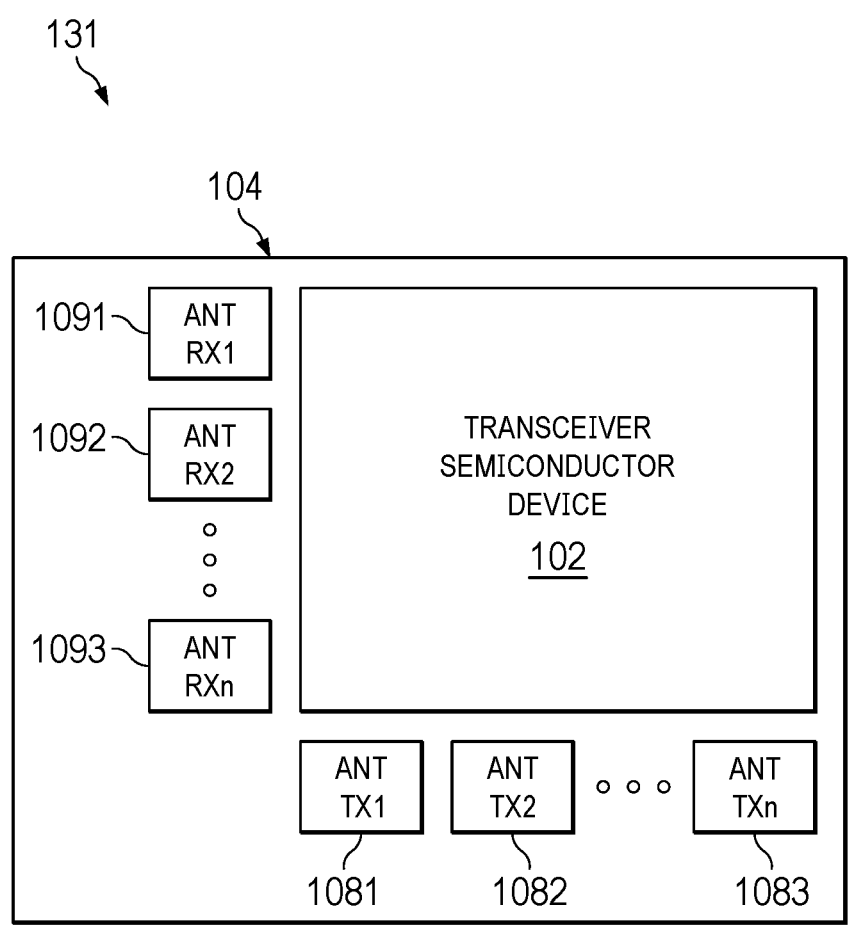
FIG. 1F illustrates, in a plan view, an arrangement with multiple antenna modules and semiconductor device in a microelectronics device package.

FIG. 1F illustrates in a plan view a microelectronics device package 131 that is similar to the microelectronics device package 125 illustrated in FIG. 1E. In FIG. 1F, a transceiver semiconductor device 102 is shown mounted to a package substrate 104. The transceiver semiconductor device 102 is electrically coupled to several receiver antenna modules 1091, 1092, 1093. The number of receiver antenna modules can vary up to an integer "n", which is a positive integer, for example 16 receiver antenna modules, or more or fewer than 16, could be used. Similarly, several transmit antenna modules 1081, 1082, 1084 are shown. These antenna modules can also vary in number up to an integer, which can be as small as two, or as much as sixteen, fewer, or more. The antenna modules 1091, 1092, 1093, and 1081, 1082, 1083 can be instances of the antenna module 108 shown in FIGS. 1A-1C, or the antenna module 128 of FIG. 1D. The antenna modules can be formed as a laminate with a core and prepreg layers, such as a BT resin laminate, or can be formed of other dielectrics and conductors, such as a semiconductor substrate, glass, ceramic, or other dielectric. In an example arrangement, the antenna modules 1091, 1092, 1093, and 1081, 1082, 1083 are arranged to receive and transmit radar signals. Millimeter wave signals can be used with the arrangements, radio frequency and other signals can be used. The antenna modules can be reusable components that can be mounted and used with a variety of semiconductor devices, and are passive components that can be designed and manufactured independently of the semiconductor device 102.

In the example arrangements, the package substrates (see package substrate 104 in FIGS. 1A-1F for example) have two trace layers, and are described as a 2-layer substrate. The antenna modules in the illustrated examples are also 2-layer laminates, with two conductor layers formed on opposite sides of a dielectric core and covered by dielectric materials such as prepreg layers. The example arrangements illustrated in FIGS. 1A-1F provide a total of four equivalent trace layers for routing and connection using a relatively inexpensive package substrate to mount the semiconductor device and the antenna modules, and using more expensive laminates for the antenna modules to provide the required high frequency performance. Other package substrates and antenna modules can be used to form additional trace layers, such as six equivalent trace layers. The use of the relatively inexpensive package substrate which has the same area as the microelectronic device package with much smaller area antenna modules lowers the cost of the microelectronic device packages using the arrangements, while maintaining or even improving the packaged device performance.

In an example, the dielectric material of the package substrates (see FIG. 1A-FIG. 1C, 104) can be a thermoplastic or a thermoset material. Thermosetting resin package build up films such as Ajinomoto Build Up Film (ABF), available from Ajinomoto Co. Inc., of Tokyo Japan, can be used. An example thermoplastic material is ABS (Acrylonitrile Butadiene Styrene). Alternative dielectric materials include ASA (Acrylonitrile Styrene Acrylate), liquid crystal polymers (LCPs), thermoset mold compound including epoxy resin, other epoxies, resins, or plastics. A mold compound 103 is shown overlying the antenna 108, and protecting the semiconductor device 102. Mold compound 103 can be a thermoset mold compound of epoxy resin, another epoxy, a resin, or plastic.

Figure 2A:
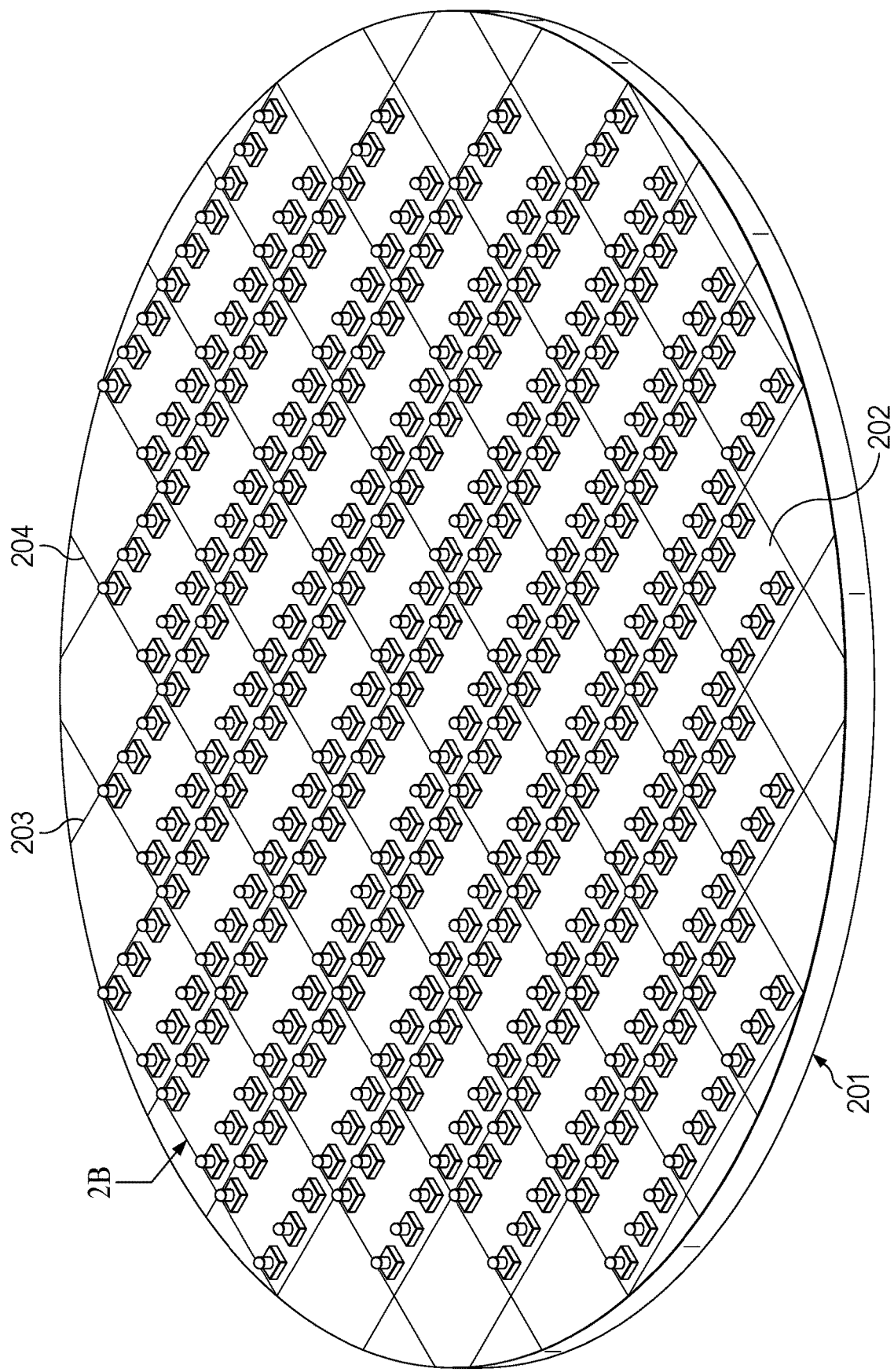
FIGS. 2A-2B illustrate, in a projection view and a close up projection view, respectively, semiconductor dies on a semiconductor wafer and an individual semiconductor die from the semiconductor wafer for use with the arrangements.
Figure 2B:
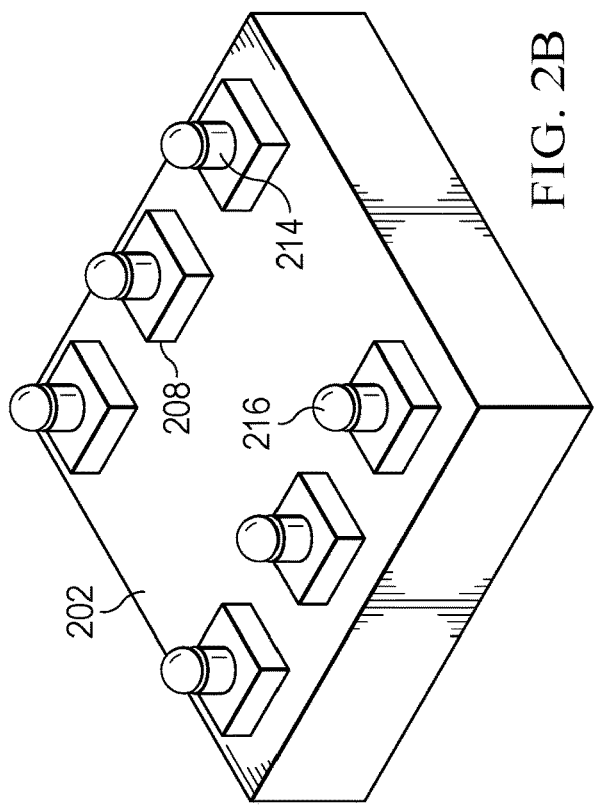

FIGS. 2A and 2B illustrate in two projection views a semiconductor wafer having semiconductor devices formed on it and configured for flip chip mounting, and an individual semiconductor die for flip chip mounting, respectively. In FIG. 2A, a semiconductor wafer 201 is shown with an array of semiconductor dies 202 formed in rows and columns on a surface. The semiconductor dies 202 can be formed using processes in a semiconductor manufacturing facility, including ion implantation, doping, anneals, oxidation, dielectric and metal deposition, photolithography, pattern, etch, chemical mechanical polishing (CMP), electroplating, and other processes for making semiconductor devices. Scribe lanes 203 and 204, which are perpendicular to one another and which run in parallel groups across the wafer 201, separate the rows and columns of the completed semiconductor dies 202, and provide areas for dicing the wafer 201 to separate the semiconductor dies 202 from one another.

FIG. 2B illustrates a single semiconductor die 202, with bond pads 208, which are conductive pads that are electrically coupled to devices (not shown) formed in the semiconductor die 202. Conductive post connects 214 are shown extending away from a proximate end mounted on the bond pads 208 on the surface of semiconductor die 202 to a distal end, and solder bumps 216 are formed on the distal ends of the conductive post connects 214. The conductive post connects 214 can be formed by electroless plating or electroplating. In an example, the conductive post connects 214 are copper pillar bumps. Copper pillar bumps can be formed by sputtering a seed layer over the surface of the semiconductor wafer 201, forming a photoresist layer over the seed layer, using photolithography to expose the bond pads 2108 in openings in the layer of photoresist, plating the copper conductive post connects 214 on the bond pads, and plating a lead solder or a lead-free solder such as an tin, silver (SnAg) or tin, silver, copper (SnAgCu) or SAC solder to form solder bumps 216 on the copper conductive post connects 214. In alternative approach, solder bumps or particles may be dropped onto the distal ends of the copper pillar bumps and then reflowed in a thermal process to form bumps. Other conductive materials can be used for the conductive post connects in an electroplating or electroless plating operation, including gold, silver, nickel, palladium, or tin, for example. Not shown for clarity of illustration are under bump metallization (UBM) portions which can be formed over the bond pads to improve plating and adhesion between the conductive post connects 214 and the bond pads 208. After the plating operations, the photoresist is then stripped, and the excess seed layer is etched from the surface of the wafer. The semiconductor dies 202 are then separated by dicing, or are singulated, using the scribe lanes 203, 204 (see FIG. 2A).

Figure 3:
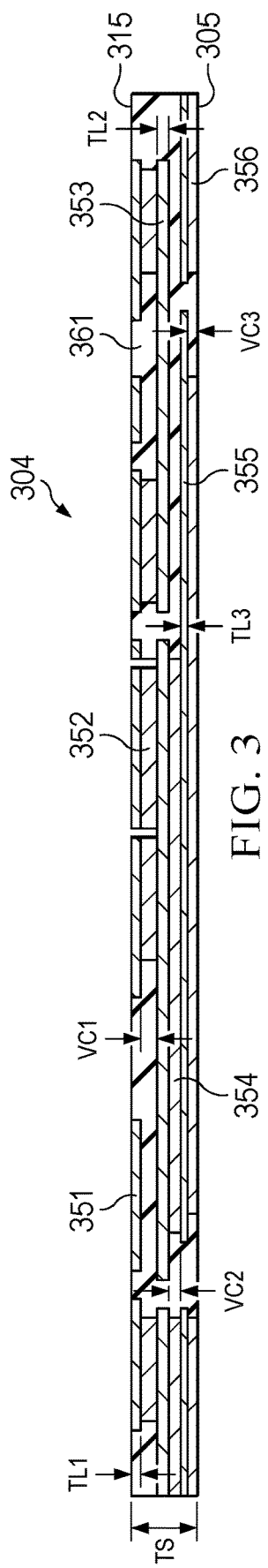
FIG. 3 illustrates, in a cross sectional view, a multilayer package substrate for use with the arrangements.

FIG. 3 illustrates in a cross sectional view a multilayer package substrate 304 that can be used with the arrangements. In FIG. 3, the multilayer package substrate 304 has a device side surface 315 and a board side surface 305. Three trace layers 351, 353, 355 are formed spaced from one another by dielectric material, the trace layers are patterned for making horizontal connections, and three vertical connection layers 352, 354, 356 form electrical connections between the three trace layers 351, 353, 355 and extend through the dielectric material 361 that is disposed over and between the trace layers. The dielectric material 361 can be a thermoplastic material such as ABF, ABS, or ASA, or can be a thermoset material, such as epoxy resin mold compound.

In one example the multilayer package substrate 304 has a substrate thickness labeled "TS" of 200 microns. The first trace layer, 351, near the device side surface 315 of the multilayer package substrate, has a trace layer thickness TL1 of 15 microns. The first vertical connection layer, 352, has a thickness VC1 of 25 microns. The second trace layer, 353, sometimes coupled to the first trace layer by the first vertical connection layer 352, has a thickness labeled TL2 of 60 microns. The second vertical connection layer, 354, has a thickness labeled VC2 of 65 microns. The third trace layer, 355, has a thickness labeled TL3 of 15 microns, and the third vertical connection layer, 356, has a thickness labeled VC3 of 25 microns. Additional layers, such as conductive lands on the device side surface 315, or terminals on the board side surface 305, may be formed by plating (not shown in FIG. 3). A continuous vertical connection between the device side surface 315 and the board side surface 305 can be formed by patterning a stack of trace layers and the corresponding vertical connection layers to form a continuous conductive path extending through the dielectric material 361. A semiconductor device mounting area positioned spaced from the antenna, as described above, can be formed by patterning the first trace layer 351.

Note that in this description, the vertical connection layers 352, 354, and 356 are not described as "vias." This is done to distinguish the vertical connections of the arrangements from the vertical connections of PCBs or other circuit board substrates, which are filled via holes. The vertical connections of the multilayer package substrates can be formed using additive manufacturing, while vias in PCBs are usually formed by removing material, for example via holes are drilled into the substrate. These via holes between conductor layers then must be plated and then filled with a conductor, which uses additional plating steps after the drilling steps. These additional steps for PCB vias are precise manufacturing processes that add costs and require additional manufacturing tools and capabilities. In contrast the vertical connection layers used in the multilayer package substrates of the arrangements are formed in the same plating processes as forming the trace layers, simplifying manufacture, and reducing costs. In addition the vertical connection layers in the arrangements can be arbitrary shapes, such as rails, columns, or posts, and the rails can be formed in continuous patterns to form electric shields, tubs, or tanks, and can be coupled to grounds or other potentials, isolating regions of the multilayer package substrate from one another. Noise reduction and the ability to create electrically isolated portions of the multilayer package substrate can be enhanced by use of the vertical connections to form tanks, shields, and tubs. Thermal performance of the microelectronic device packages of example arrangements can be improved by use of the vertical connection layers to form thermally conductive columns, sinks or rails that can be coupled to thermal paths on a system board to increase thermal dissipation from the semiconductor devices mounted on the multilayer package substrate.

Figure 4A:
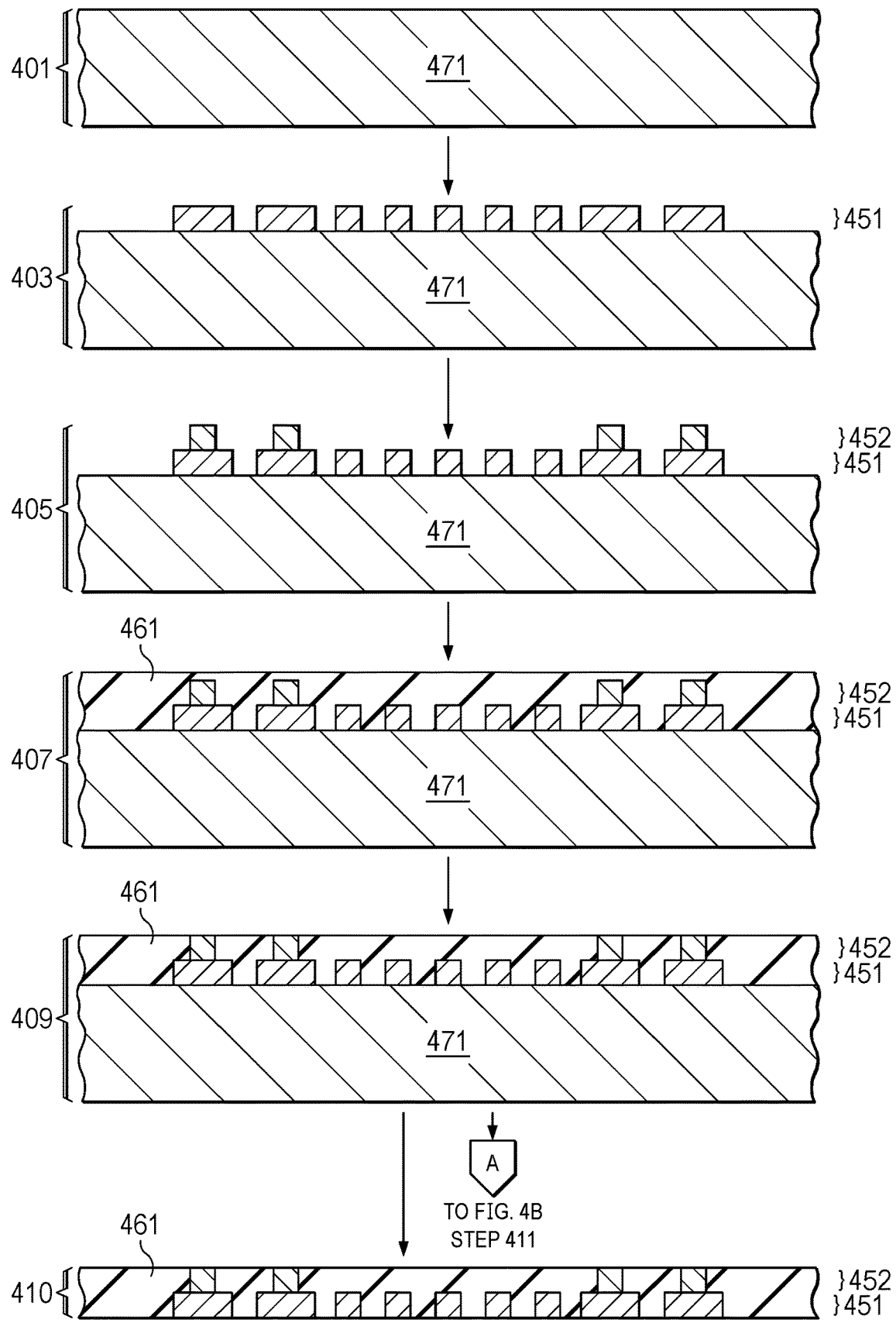
FIGS. 4A-4B illustrate, in a series of cross sectional views, the major steps in manufacturing a multilayer package substrate that can be used in the arrangements.
Figure 4B:
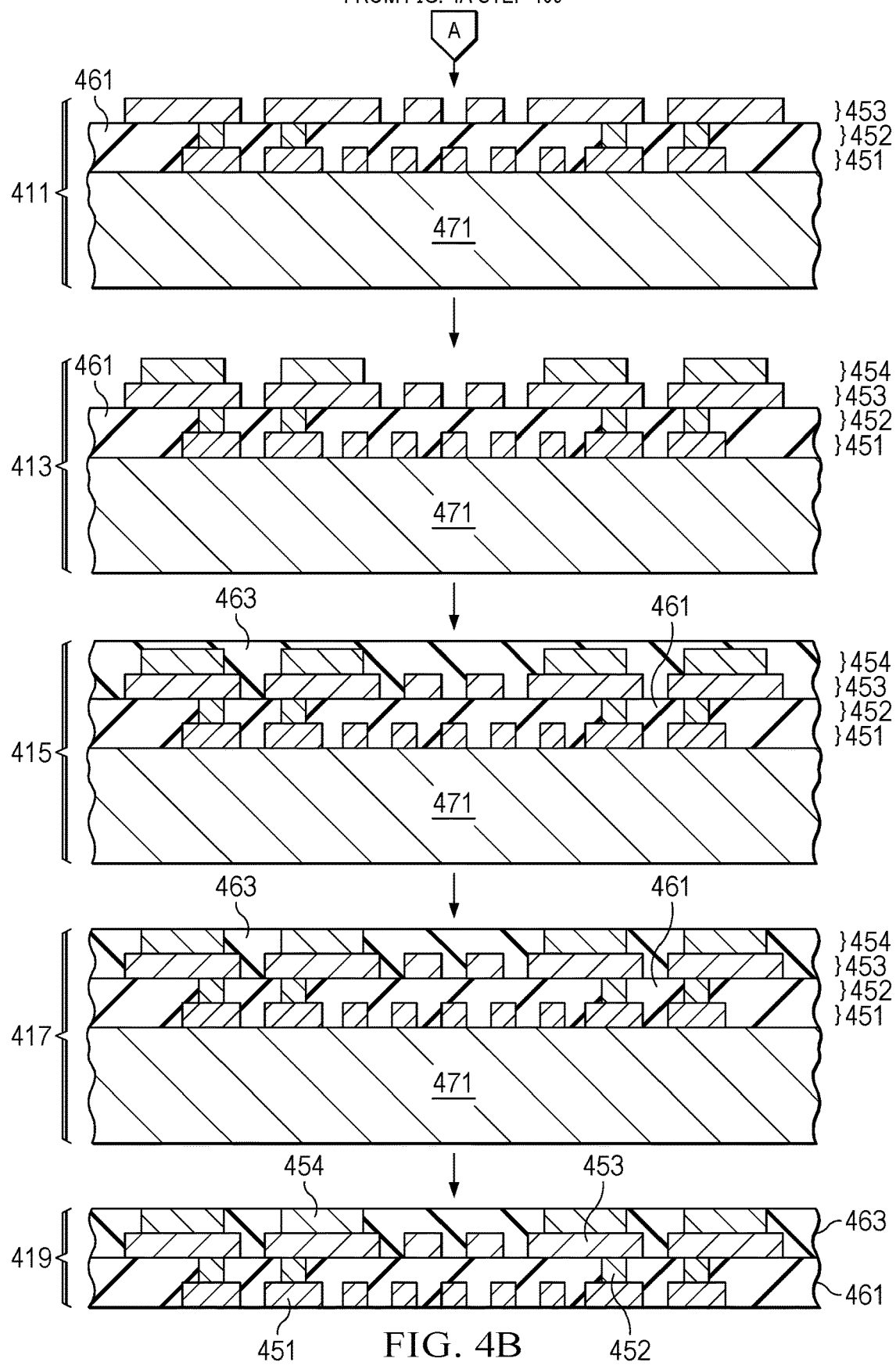

FIGS. 4A-4B illustrate, in a series of cross sectional views, selected steps for a method for forming a multilayer package substrate that is useful with the arrangements. In FIG. 4A, at step 401, a metal carrier 471 is readied for a plating process. The metal carrier 471 can be stainless steel, steel, aluminum or another metal that will support the multilayer package substrate layers during plating and molding steps, the multilayer package substrate is then removed, and the metal carrier is cleaned for use in additional manufacturing processes.

At step 403, a first trace layer 451 is formed by plating. In an example process, a seed layer is deposited over the surface of the metal carrier 471, by sputtering, chemical vapor deposition (CVD) or other deposition step. A photoresist layer is deposited over the seed layer, exposed, developed and cured to form a pattern to be plated. Electroless or electroplating is performed using the exposed portions of the seed layer to start the plating, forming a pattern according to patterns in the photoresist layer.

At step 405, then plating process continues. A second photoresist layer is deposited, exposed, and developed to pattern the first vertical connection layer 452. By leaving the first photoresist layer in place, the second photoresist layer is used without an intervening strip and clean step, to simplify processing. The first trace layer 451 can be used as a seed layer for the second plating operation, to further simplify processing.

At step 407, a first molding operation is performed. The first trace layer 451 and the first vertical connection layer 452 are covered in a dielectric material. In an example a thermoplastic material is used, in a particular example ABF is used; in alternative examples ABS or ASA can be used, or a thermoset epoxy resin mold compound can be used, or resins, epoxies, or plastics can be used. In an example compressive molding operation, a mold compound can be heated to a liquid state, forced under pressure through runners into a mold to cover the first trace layer 451 and the first vertical connection layer 452, and subsequently cured to form solid mold compound layer 461.

At step 409, a grinding operation performed on the surface of the mold compound 461 exposes a surface of the vertical connection layer 452 and provides conductive surfaces for mounting devices, or for use in additional plating operations. If the multilayer package substrate is complete, the method ends at step 410, where a de-carrier operation removes the metal carrier 471 from the dielectric material 461, leaving the first trace layer 451 and the first vertical connection layer 452 in a dielectric material 461, providing a package substrate.

In examples where additional trace layers and additional vertical connection layers are needed, the method continues, leaving step 409 and transitioning to step 411 in FIG. 4B.

At step 411, a second trace layer 453 is formed by plating using the same processes as described above with respect to step 405. A seed layer for the plating operation is deposited and a photoresist layer is deposited and patterned, and the plating operation forms the second trace layer 453 over the mold compound 461, with portions of the second trace layer 453 electrically connected to the first vertical connection layer 452.

At step 413, a second vertical connection layer 454 is formed using an additional plating step on the second trace layer 453. The second vertical connection layer 454 can be plated using the second trace layer 453 as a seed layer, and without the need for removing the preceding photoresist layer, simplifying the process.

At step 415, a second molding operation is performed to cover the second trace layer 453 and the second vertical connection layer 454 in a layer of dielectric material 463. The multilayer package substrate at this stage has a first trace layer 451, a first vertical connection layer 452, a second trace layer 453, and a second vertical connection layer 454, portions of the layers are electrically connected together to form vertical paths through the mold compound layers 461 and 463.

At step 417, the mold compound layer 463 is mechanically ground in a grinding process or chemically etched to expose a surface of the second vertical connection layer 454. At step 419 the example method ends by removing the metal carrier 471, leaving a multilayer package substrate including the conductor layers 451, 452, 453 and 454 in dielectric layers 461, 463. The steps of FIGS. 4A-4B can be repeated to form multilayer package substrates for use with the arrangements having more layers, by performing plating of a trace layer, plating of a vertical connection layer, molding, and grinding, repeatedly.

Useful sizes for an example of the multilayer package substrate could be from two to seven millimeters by two to seven millimeters, for example. The size of the multilayer package substrate can be varied depending on the size and number of semiconductor devices mounted, as well as the patch antenna dimensions, so that the area of the device side surface is sufficient for mounting the semiconductor devices and the antenna spaced from the semiconductor devices. As frequencies increase, the wavelengths become compatible with microelectronics package sizes, for example millimeter wave signals between 30 and 300 GHz have wavelengths of between 10 and 1 millimeters. The antenna modules of the arrangements take advantage of these sizes. As the transmit and receive frequencies increase and wavelengths correspondingly decrease, the size of the patch antenna may decrease, and the useful sizes of the multilayer package substrate may also decrease. The arrangements are useful in implementing antennas with millimeter wave frequencies, radar frequencies, and 5G standard frequencies, for example.

FIG. 5A illustrates, in a graph, curves 511 and 513 that illustrate the return loss performance of an arrangement such as is shown in FIGS. 1A-1E and an approach for a microelectronics device package formed without use of the arrangements where slotted patch antennas were patterned on the package substrate itself. The graphs in FIG. 5A were obtained using a high frequency steady state (HFSS) simulation of a radar transceiver device coupled to slotted patch antennas. Curves 511 and 513 illustrates the return loss performance of both the device using the arrangements (curve 511) and a device formed without use of the arrangements (curve 513). In the graph of FIG. 5A, the frequency is varied from a frequency of 40 GHz to 80 GHz (plotted on the x-axis) with the return loss shown in dB on the y-axis. A goal is a return loss of less than −20 dB, with a lower number indicating better performance. As is apparent from examining FIG. 5A, the antennas were designed, in both cases, for a desired operating frequency band of 58-66 GHz, where the return loss curves fall. The device using the arrangements, curve 511, has a return loss of approximately −29 dB at the minimum, which is at approximately the middle frequency in the operating range, of about 62 GHz. The results for the device formed without use of the arrangements, curve 513, has a return loss of about −20 dB at the minimum, the simulation shows that the use of the arrangements reduced the return loss by about −9 dB.

FIG. 5B illustrates another graph of simulation results that compares channel-to-channel isolation for the antenna modules in the microelectronics device package with the arrangements to the results for a device where the antennas are formed in a laminate package substrate that carries the semiconductor device. The curve 521 illustrates the channel to channel isolation for the device using the arrangements, using a frequency from 40 to 80 GHz plotted on the x axis, the performance in dB is shown on the vertical chart, on the y axis. The simulation was performed with the antenna modules designed and optimized for operating in a frequency band from 58-66 GHz. The curve 523 illustrates the same curve for the same frequency band from 58-66 GHz, for a device formed without use of the arrangements. A goal for the channel to channel isolation is −20 dB, and both designs meet this goal or metric, however the curve 521 for the arrangements illustrates an improvement of approximately −6 dB, with a minimum of −43 dB at about 63.5 GHz. The design formed without the arrangements shown in curve 523 has a minimum of −36 dB at about 61 GHz. FIG. 5B shows that the use of the arrangements results in a performance increase, while reducing overall costs of the packaged device.

Figure 6:
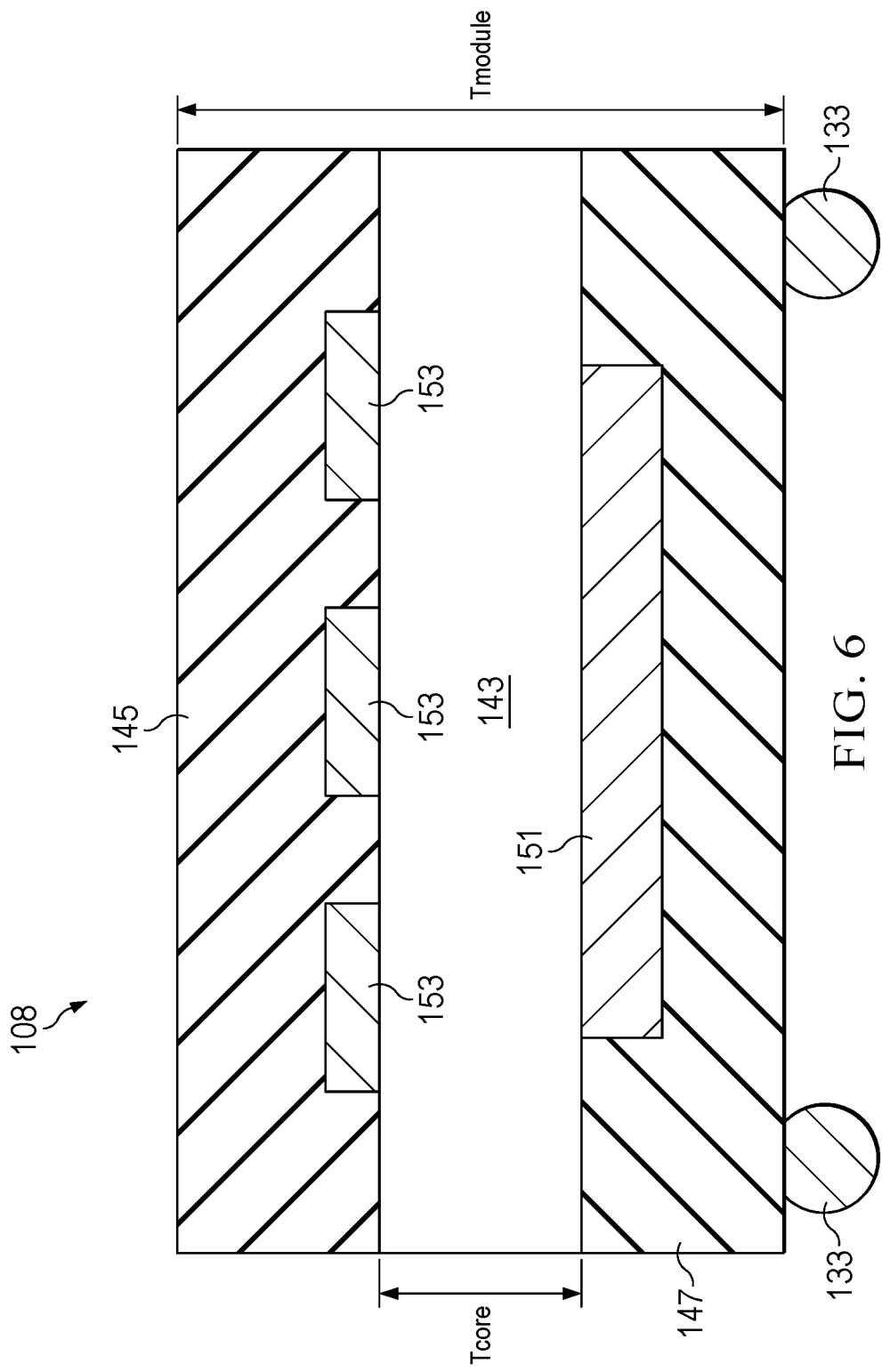
FIG. 6 illustrates, in a cross sectional view, an antenna module for use with the arrangements.

FIG. 6 illustrates, in a cross sectional view, further details of an example antenna module 108. In FIG. 6, a core 143 is a laminate of a cured resin clad with conductive materials that are patterned to form radiator elements of conductors 153 and a ground plane reflector 151 on opposing sides of the core 143. Dielectric layers 145, which can be resin prepreg materials 145 and 145, cover the radiator elements (layer 145) and the ground plane reflector (layer 147). Solder balls or bumps 133 are shown on a device mounting surface of the antenna module 108 to allow the antenna module to be mounted using a solder reflow process. The antenna module 108 includes vertical electrical connections to couple the solder balls 133 to the radiator elements formed with conductors 153 and to the ground plane reflector 151, these vertical connections are not visible in the cross section in FIG. 6. The example antenna module 108 has a core thickness labeled "Tcore" in FIG. 6, in example arrangements this thickness "Tcore" varied between about 40 microns to about 80 microns. Because the radiator elements formed with conductors 153 and the ground plane reflector 151 are spaced by the thickness Tcore, the thickness can be varied with the frequency or wavelength of the signals the antenna module 108 is optimized for, and so increase performance. If the thickness Tcore is a quarter of the wavelength (214), for example, then due to the laws of reflection, the reflected signals in a transmit antenna application will constructively interfere with the radiated signals at the radiator elements formed with conductors 153. By sizing the distance the signal traverses in traveling to the ground plane reflector 151, being reflected, and traveling back to the radiator elements formed with conductors 153 as a quarter wavelength distance, the reflected signal will be in phase with the radiated signal, having traversed a distance corresponding to a phase shift of λ. Other designs that increase performance can be arranged using various thicknesses for the laminate structure of antenna module 108. By varying the antenna module thicknesses between the radiators and the reflectors, for example, the antennas can be tuned for optimizing at a particular frequency, and efficiency can be increased. Simulation tools can be used to optimize the antenna module design without the need to modify the corresponding package substrate design, reducing costs. The antenna modules are reusable components so that the design costs need not be repeated for a new microelectronics device package.

An example laminate material that is useful with the antenna modules of the arrangements is a low loss, low coefficient of thermal expansion (CTE), BT laminate available commercially from Mitsubishi Gas Chemical of Tokyo, Japan and designated as the copper clad laminate CCL-HL972LF type LD series, with prepreg materials designated GHPL-970LF type LD series. These materials are indicated by the manufacturer as particularly suitable for high frequency and high speed signals. Other BT resin laminates can be used, coreless laminates can be used, embedded trace substrates (ETS) can be used, molded interconnect substrates (MIS) can be used, alternative laminate materials such as laminates made using polyimides, cyanate ester resins, polyesters, dielectric films, ceramics or other dielectric materials can be used; in further alternative arrangements the antenna modules can be implemented as direct resonant antennas (DRA) formed of dielectrics without the need of conductors. In an example the DRA can be a dielectric with a shape that resonates at a frequency of interest when the electromagnetic energy is input to the DRA by a feed line, such as a coplanar waveguide (CPW) structure on the package substrate. Because the DRA is a dielectric shape, no radiator elements are used. The DRA can be a cube, cylinder, hemisphere or other shape determined in simulations using the dielectric constant of the material used.

In the illustrated examples, the package substrates implement "2-layer" substrates, with two trace layers carrying signals and vertical connections between the two trace layers. The antenna modules shown in the illustrated examples also implement 2-layer laminates, for a total of four equivalent trace layers. The arrangements provide the routing and connectivity of a 4-layer package substrate, while using only two trace layers in the package substrate, with the antenna modules providing two additional trace layers, one for the radiator element conductors, and one for the ground plane reflector. Additional layers can be provided in either the package substrate or the antenna modules. By using a package substrate that has two layers in the examples, the cost for the packaged devices in the arrangements is reduced when compared to the more expensive laminates used without the arrangements, while as discussed above, use of the arrangements provide similar or even increased device performance.

Figure 7:
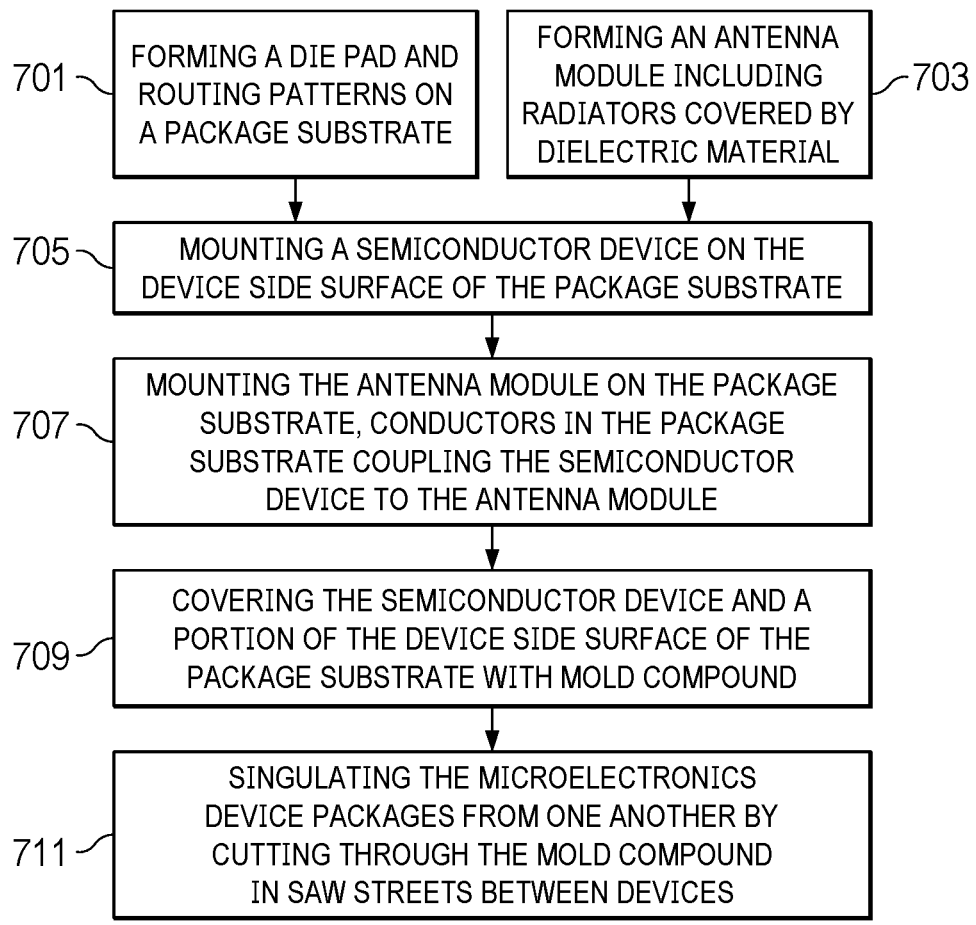
FIG. 7 illustrates, in a flow diagram, selected steps of a method for forming the arrangements.

FIG. 7 illustrates, in a flow diagram, steps for forming an arrangement. At step 701, a die pad for mounting a semiconductor device and routing patterns are formed on a package substrate. At step 703 an antenna module is formed by covering radiator elements with a dielectric material. As shown in FIG. 7, steps 701 and 703 are independent and can be performed at any time and in parallel, or asynchronously, at different locations and at different times. At step 705, a semiconductor device is mounted is mounted on the device side surface of the package substrate. At step 707, an antenna module is mounted on the package substrate, with conductors in the package substrate coupling the antenna module to the semiconductor device. At step 709, the semiconductor device and at least a portion of the package substrate and covered by mold compound. At step 711, the microelectronic devices packages are separated one from another by cutting through the mold compound in saw streets between the devices.

The use of the arrangements provides a microelectronic device package with an integrated antenna module and a semiconductor device. Existing materials and assembly tools are used to form the arrangements, and the arrangements are low in cost when compared to solutions using the conductors in a laminate package substrate to form and carry the antennas. The arrangements are formed using existing methods, materials and tooling for making the devices and are cost effective.

Modifications are possible in the described arrangements, and other alternative arrangements are possible within the scope of the claims.

What is claimed is:

1. An apparatus, comprising:
   a semiconductor device mounted to a device side surface of a package substrate, the package substrate having a board side surface opposite the device side surface;
   an antenna module mounted to the package substrate via a solder ball, the antenna module coupled to the semiconductor device, the antenna module further comprising radiator elements formed of conductor material on one surface of a core, and comprising a ground plane reflector formed of the conductor material on an opposite surface of the core, and having dielectric material over the radiator elements and over the ground plane reflector; and
   mold compound covering the semiconductor device, and a portion of the package substrate.

2. The apparatus of claim 1, wherein the semiconductor device is a transceiver.

3. The apparatus of claim 1, wherein the antenna module is mounted on the device side of the package substrate and is covered by the mold compound.

4. The apparatus of claim 1, wherein the antenna module is mounted on the device side of the package substrate and is partially covered by the mold compound, and wherein the antenna module has a surface exposed from the mold compound.

5. The apparatus of claim 1, wherein the antenna module is mounted on the board side surface of the package substrate.

6. The apparatus of claim 1, wherein the package substrate is a multilayer package substrate having at least two trace layers.

7. The apparatus of claim 6, wherein the antenna module is a laminate having at least two trace layers, one of the at least two trace layers forming radiator elements, and another one of the at least two trace layers forming a ground plane reflector.

8. The apparatus of claim 1, wherein the package substrate has a first area, and the antenna module has a second area that is less than the first area.

9. The apparatus of claim 1, wherein the antenna module comprises a first antenna module, and further comprising additional antenna modules mounted to the package substrate.

10. The apparatus of claim 9, wherein the semiconductor device is a radar transceiver, and the antenna module and additional antenna modules comprise receive antenna modules and transmit antenna modules.

11. The apparatus of claim 1, wherein the antenna module further comprises an antenna optimized for a frequency between 30 and 300 GHz.

12. The apparatus of claim 1, wherein the antenna module further comprises an antenna optimized for a frequency between 58 and 68 GHz.

13. The apparatus of claim 1, wherein the antenna module is a direct resonant antenna.

14. The apparatus of claim 1, wherein the antenna module comprises a laminate comprising radiator elements formed of a conductor material on one side of a resin core, and comprising a ground plane reflector formed of the conductor material on an opposite side of the resin core, and having dielectric material over the radiator elements and over the ground plane reflector, the radiator elements forming a slot antenna.

15. The apparatus of claim 14, wherein the conductor material is of copper, aluminum, silver, or gold.

16. The apparatus of claim 1, wherein the semiconductor device is a semiconductor die that is flip chip mounted to the device side surface of the package substrate, the semiconductor die having conductive post connects extending from the semiconductor die, the conductive post connects with a proximate end on a bond pad on the semiconductor die and extending to a distal end away from the semiconductor die, and having a solder bump on the distal end of the conductive post connects, the solder bumps forming bonds to the package substrate.

17. The apparatus of claim 1, wherein the package substrate further comprises a multilayer package substrate having dielectric material between conductor layers comprising Ajinomoto Build Up Film (ABF), acrylonitrile butadiene styrene (ABS), acrylonitrile styrene acrylate (ASA), or epoxy resin.

18. The apparatus of claim 17, wherein the conductor layers in the multilayer package substrate are of copper, gold, aluminum, silver or an alloy thereof.

19. The apparatus of claim 1 wherein the ground plane reflector of the antenna module is spaced from radiator elements by a distance corresponding to a quarter of a wavelength for a predetermined frequency.

* * * * *